United States Patent [19]

Miyazaki et al.

[11] Patent Number: 5,355,171
[45] Date of Patent: Oct. 11, 1994

[54] DIGITAL OSCILLATOR AND COLOR SUBCARRIER DEMODULATION CIRCUIT HAVING THE DIGITAL OSCILLATOR

[75] Inventors: Toru Miyazaki, Yokohama; Kiyoyuki Kawai, Yokosuka, both of Japan

[73] Assignee: Kabushiki Kaisha Toshiba, Kawaski, Japan

[21] Appl. No.: 954,503

[22] Filed: Sep. 29, 1992

[30] Foreign Application Priority Data

Sep. 30, 1991 [JP]  Japan .................................. 3-252250

[51] Int. Cl.$^5$ .................................. H04N 9/45
[52] U.S. Cl. .................................. 348/505; 348/540; 348/549; 375/97; 307/271
[58] Field of Search ....................... 358/23, 19, 20, 24, 358/25, 148, 149, 158, 159; 377/94, 95; 307/271, 490; 328/127; 375/97; 364/721; H04N 9/66, 9/455, 9/45

[56] References Cited

U.S. PATENT DOCUMENTS

| | | | |
|---|---|---|---|
| 4,599,583 | 7/1986 | Shimozono | 364/721 |
| 4,625,232 | 11/1986 | Nillesen | 358/23 |
| 4,689,664 | 8/1987 | Möring | 358/23 |
| 4,862,098 | 8/1989 | Yassa | 329/50 |
| 5,010,506 | 4/1991 | Hrncirik | 364/721 |
| 5,070,254 | 12/1991 | Summers | 307/261 |
| 5,181,115 | 1/1993 | Flamm | 358/148 |

*Primary Examiner*—James J. Groody
*Assistant Examiner*—Sherrie Hsia
*Attorney, Agent, or Firm*—Cushman, Darby & Cushman

[57] ABSTRACT

A digital oscillator including an integrator for cumulatively integrating a specified signal and a controller responsive to a control signal for maintaining the output frequency of the integrator within a limit corresponding to the amplitude of the control signal.

10 Claims, 6 Drawing Sheets

DIGITAL OSCILLATOR AND COLOR SUBCARRIER DEMODULATION CIRCUIT HAVING THE DIGITAL OSCILLATOR

FIELD OF THE INVENTION

The present invention relates to a digital oscillator and a color subcarrier demodulation circuit having the digital oscillator, which are suitable for video tape recorders and television receivers.

BACKGROUND OF THE INVENTION

Recently, television receivers, which use digital signal processing systems, have been developed. A specialized reproduction function which uses digital memories such as still picture reproduction can be simply achieved by constructing a television receiver with a digital signal processing system.

Among the types of digital television receivers, there are those which adopt a clock fH phase-synchronized with the horizontal synchronization signal and those which adopt a clock fsc phase-synchronized with the burst signal, which is a reference for the color subcarrier, as the system clock. When a clock fsc phase-synchronized with the burst signal is used, in the case of color demodulation, the B-Y and R-Y color difference signals can be demodulated by latching the color component to timing synchronized to the clock. Thus, a simple construction of the color demodulation circuit is achieved.

However having the case of a VCR (Video Tape Recorder), in image signals, which contain jitter, the color subcarrier frequency and the horizontal synchronization signal frequency diverge from an interleaved relationship. That is to say, in this case, if clock fsc is adopted, the sampling point of the horizontal synchronization signal is not constant, and the horizontal output pulse is bound to have jitter. For this reason, there is a disadvantage in that the amount of digital data in one horizontal period or one vertical period will not be constant.

Therefore, this type of case requires the adoption of the clock fH type system. However, in the NTSC and PAL systems, a color subcarrier is required in order to execute synchronized demodulation of the AM-modulated signals. For this reason, the design is such that a clock phase-synchronized with the color subcarrier is demodulated by the clock fH.

FIG. 1 is a block diagram showing a prior art color subcarrier demodulation circuit which generates clock fH and, at the same time, demodulates the color subcarrier using this clock fH.

The analog video signal input through input terminal 1 is supplied to A/D converter 2. A/D converter 2 samples the input analog video signal at a clock rate with frequency nfH (hereafter, clock nfH) from waveform shaping circuit 12 (described below), and converts it to a digital signal. The digitized video signal is supplied to horizontal synchronization signal separation circuit 3. Horizontal synchronization signal separation circuit 3 separates the horizontal synchronization signal from the digital video signal and supplies it to phase comparator 4. At the same time, frequency divider circuit 5 divides clock nfH from waveform shaping circuit 12 by n and supplies a signal with frequency fH to phase comparator 4. Phase comparator 4 compares the phases of the two inputs and outputs a phase error signal to loop filter 6. The phase error signal is integrated by a specified time constant in loop filter 6 and is output as control signal CH for digital oscillator 7. A clock of frequency fx is also supplied from crystal oscillator 8 to digital oscillator 7.

FIG. 2 is a circuit diagram showing a practical construction of digital oscillator 7, and FIG. 3 is a waveform diagram illustrating its operation.

Control signal CH is input from loop filter 6 to digital oscillator 7 via input terminal 21. The m1 bit adder 22 adds the output of data flip-flop (hereafter, DFF) 23 and control signal CH and outputs this to DFF 23. DFF 23 supplies the output of adder 22 to adder 22 at a clock of frequency fx which is input via terminal 24. That is to say, control signal CH is cumulatively integrated at every clock cycle by adder 22 and DFF 23. As shown in FIG. 3, a sampled saw-tooth wave with an amplitude of two (2) powered by m1 sampled at a cycle of 1/fx appears at output terminal 25. Since the oscillation frequency f1 of this saw-tooth wave is regulated by the cycle of 1 sample being 1/fx, it can be expressed by the following Equation (1).

$$f1 = (CH/2^{m1}) \cdot fx \tag{1}$$

As shown by Equation (1), the output of digital oscillator 7 is proportional to control signal CH, the phase error signal from phase comparator 4. The output signal of digital oscillator 7 is converted from a saw-tooth wave to a sine-wave in sine-wave converter (hereafter referred to SIN converter) 9. It is then converted to an analog signal by D/A converter 10, and is supplied to low-pass filter (referred to as LPF, hereafter) 11. LPF 11 eliminates the feed-back component of the input analog signal then supplies the input analog signal to waveform shaping circuit 12. Waveform shaping circuit 12 shapes the waveform of the output of LPF 11 to a binary digital signal. The output clock of waveform shaping circuit 12 is divided into 1/n by frequency divider circuit 5 and is fed back to phase comparator 4. That is to say, a phase-locked loop (PLL) is composed of phase comparator 4, loop filter 6, digital oscillator 7, SIN converter 9, D/A converter 10, LPF 11, waveform shaping circuit 12 and frequency divider circuit 5. A clock nfH of frequency n times is output from waveform shaping circuit 12 by phase-synchronization with the horizontal synchronization signal from horizontal synchronization signal separation circuit 3.

At the same time, the digital video signal from A/D converter 2 is also supplied to burst separator circuit 13. Burst separator circuit 13 extracts the burst signal, which is the reference of the color subcarrier and outputs this to phase comparator 14. Phase comparator 14 compares the phases of the extracted burst signal and the output signal of SIN converter 17 (described below) and supplies a phase error signal to loop filter 15. Loop filter 15 integrates the phase error signal by a specified time constant and outputs the integrated phase error signal as control signal CS for digital oscillator 16. Digital oscillator 16, which has the same composition as digital oscillator 7, cumulatively integrates control signal CS at every cycle of clock nfH from waveform shaping circuit 12. Therefore, the oscillation output of digital oscillator 16 becomes a saw-tooth wave in which the frequency is proportional to phase error signal CS.

The oscillation output of digital oscillator 16 is supplied to SIN converter 17 and converted into a sine wave. The output of SIN converter 17 is output to output terminal 18 and is also fed back to phase comparator 14. Thus, a PLL is comprised phase comparator 14, loop filter 15, digital oscillator 16 and SIN converter 17. The burst signal from burst separator circuit 13, that is to say, a demodulated color subcarrier, which is phase synchronized to the color subcarrier, is output at output terminal 18.

Digital oscillator 16 is operated by clock nfH from waveform shaping circuit 12, and its oscillating frequency fsc1 is expressed by the following Equation (2). Here, m2 is the number of integration bits of digital oscillator 16.

$$\begin{aligned} fsc1 &= (Cs/2^{m2}) \cdot (CH/2^{m1}) \cdot fx \\ &= (Cs \cdot CH/2^{m1+m2}) \cdot fx \end{aligned} \quad (2)$$

As shown by this Equation (2), apart from the oscillation frequency of digital oscillator 16 being influenced by control signal CS from loop filter 15, it is also influenced by the output signal CH of loop filter 6. Therefore, there is a problem in that, the oscillation frequency of digital oscillator 16 becomes unstable due to the fluctuation of control signal CH in the state at which the relationship between the horizontal synchronization frequency and the color subcarrier frequency rapidly fluctuate (as in VCR and the like).

To take account of this point, a method of demodulating a color subcarrier corresponding to the rapid fluctuation of the horizontal synchronization signal has been disclosed in the specification of U.S. Pat. No. 4,625,232. FIG. 4 is a block diagram showing a prior art color subcarrier demodulation circuit to which this method has been applied.

The point at which FIG. 4 differs from FIG. 1 is that divider 19 has been added between loop filter 15 and digital oscillator 16. Divider 19 is designed to divide control signal CS from loop filter 15 by control signal CH from loop filter 6 and supply the division result to digital oscillator 16 as a control signal.

In this case, oscillation frequency fsc2 of digital oscillator 16 can be expressed by the following Equation (3).

$$\begin{aligned} fsc2 &= (Cs/CH \cdot 2^{m2}) \cdot nfx \\ &= (Cs/CH \cdot 2^{m2}) \cdot (CH/2^{m1}) \cdot fx \\ &= (Cs/2^{m1+m2}) \cdot fx \end{aligned} \quad (3)$$

As shown in Equation (3), oscillation frequency fsc2 of digital oscillator 16 is not affected by control signal CH of loop filter 6. Thus, in FIG. 4, the fluctuation of system clock nfH is compensated. Therefore, in the color subcarrier demodulation circuit in FIG. 4, even if the relationship between the horizontal synchronization frequency and the color subcarrier frequency fluctuates rapidly, a stable demodulated color subcarrier can be demodulated.

However, in the composition of FIG. 4, digital oscillator 16 is controlled by the same divider 19 output throughout 1 horizontal period. Therefore, the output phase error of digital oscillator 16 due to the error of the division result produced by the bit limits of divider 19 accumulates throughout one (1) horizontal period. For instance, in the case of the frequency nfH of the system clock being set at 910 times the horizontal synchronization frequency, the phase error also will be 910 times. For this reason, the operation accuracy of divider 19 is required to be sufficiently high. That is to say, it is necessary to increase the bit number of the control signal supplied to digital oscillator 16. This leads to increasing the scale of the hardware.

In in the prior art color subcarrier demodulation circuit described above, the output phase error of the digital oscillator based on the operation error of the divider accumulates throughout one (1) horizontal period. Therefore, there is a problem in that a high operation accuracy of the divider is required, and it is necessary to increase the scale of the hardware construction.

SUMMARY OF THE INVENTION

It is, therefore, an object of the present invention to provide a digital oscillator which has a simple circuit construction.

Another object of the present invention is to provide a digital oscillator which can stably demodulate a color subcarrier.

A further object of the present invention is to provide a color subcarrier demodulation circuit having a digital oscillator.

The digital oscillator according to one aspect of the present invention has an integrator for cumulatively integrating a specified signal and a controller responsive to a control signal for maintaining the output frequency of the integrator within a limit corresponding to the amplitude of the control signal.

The color subcarrier demodulation circuit according to another aspect of the present invention has a horizontal synchronization signal separation circuit that separates the horizontal synchronization signal from the input television signal, a first phase comparator that outputs a first phase error signal based on the phase error by comparing the phases of the horizontal synchronization signal and the demodulated horizontal synchronization signal, a horizontal synchronization signal demodulation means that generates a clock, which is phase-synchronized with the horizontal synchronization signal based on the first error signal, and feeds the clock back to the first phase comparator as the demodulated horizontal synchronization signal, a burst separator circuit that separates the burst signal from the input television signal, a second phase comparator that outputs a second phase error signal based on the phase error by comparing the phases of the burst signal and the demodulated color subcarrier, a digital oscillator having a control device that controls the limits of the integrated value from a cumulative integration device, which outputs integrated values through cumulative integration of the second phase error signal based on the clock from the horizontal synchronization signal demodulation means, and a normalization circuit which normalizes the oscillation output of this digital oscillator using the first phase error signal, and feeds it back to the second phase comparator as the demodulated color subcarrier.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
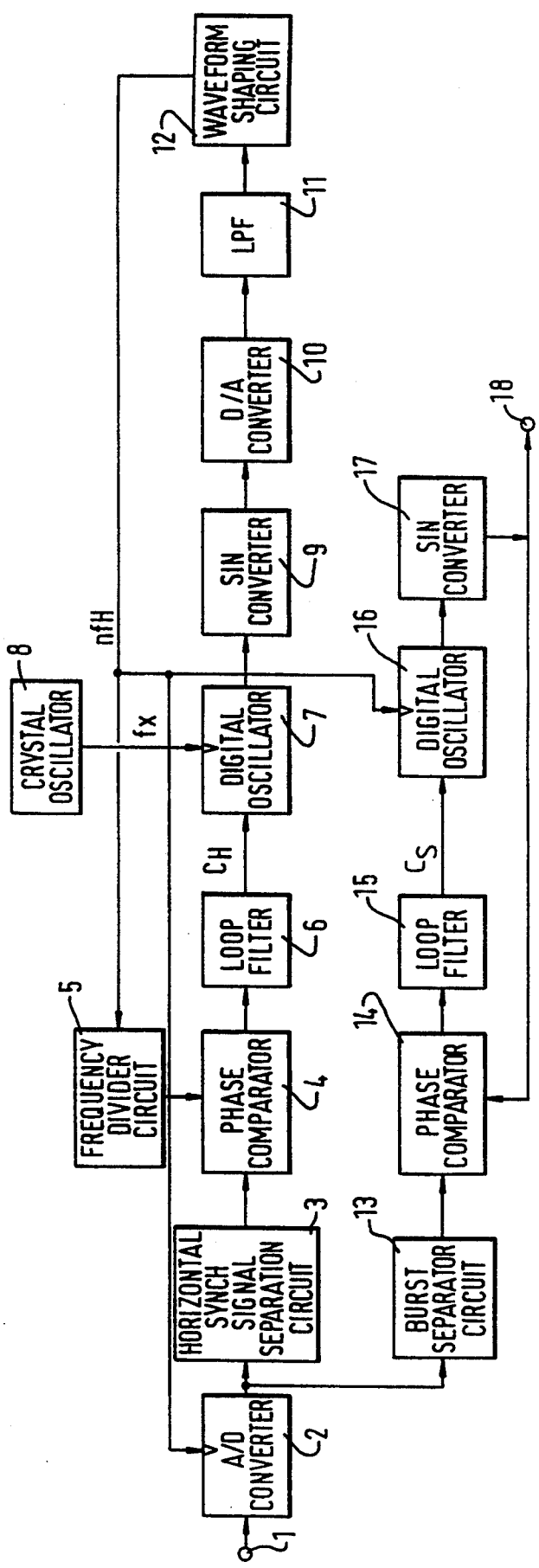
FIG. 1 shows a block diagram of a prior art color subcarrier demodulation circuit.
Figure 2:
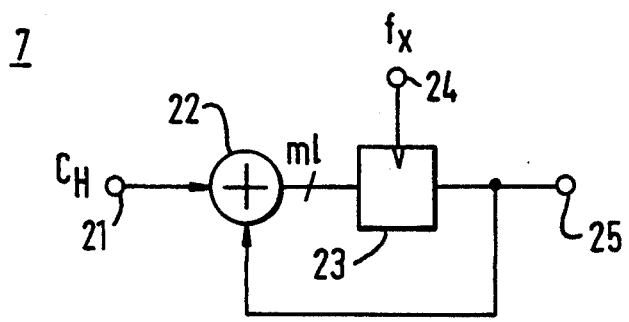
FIG. 2 shows a block diagram of the digital oscillator in FIG. 1.
Figure 3:
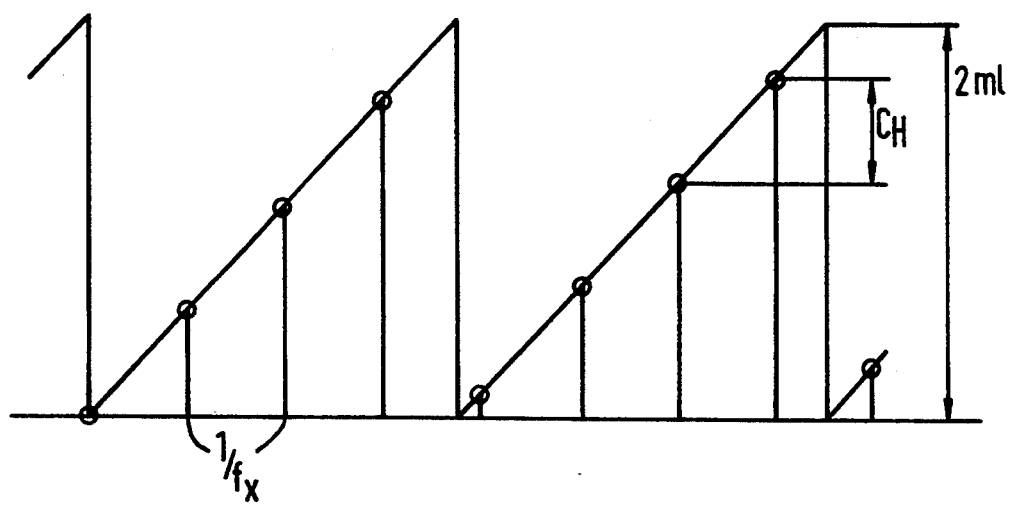
FIG. 3 shows a waveform diagram of the oscillation output of a prior art digital oscillator.
Figure 4:
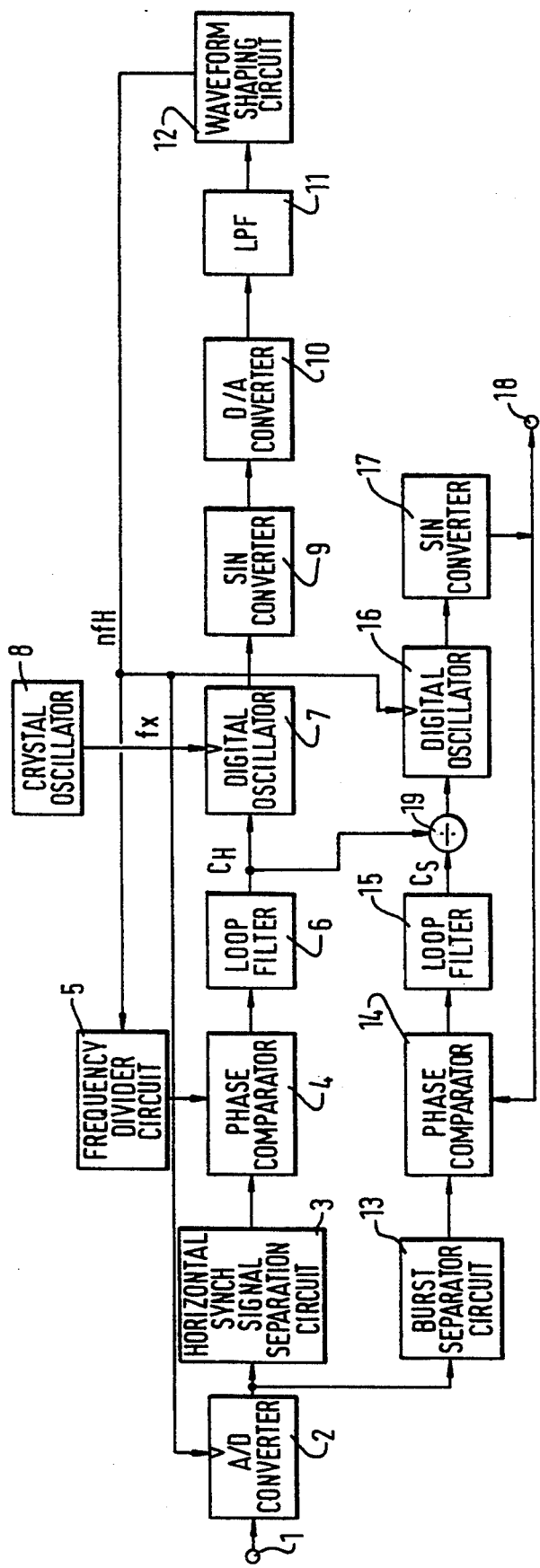
FIG. 4 shows a block diagram of a prior art color subcarrier demodulation circuit.

The present invention will be described in detail with reference to the FIGS. 5 through 9. Throughout the drawings, reference numerals or letters used in FIGS. 1 through 4 will be used to designate like or equivalent elements for simplicity of explanation.

Figure 5:
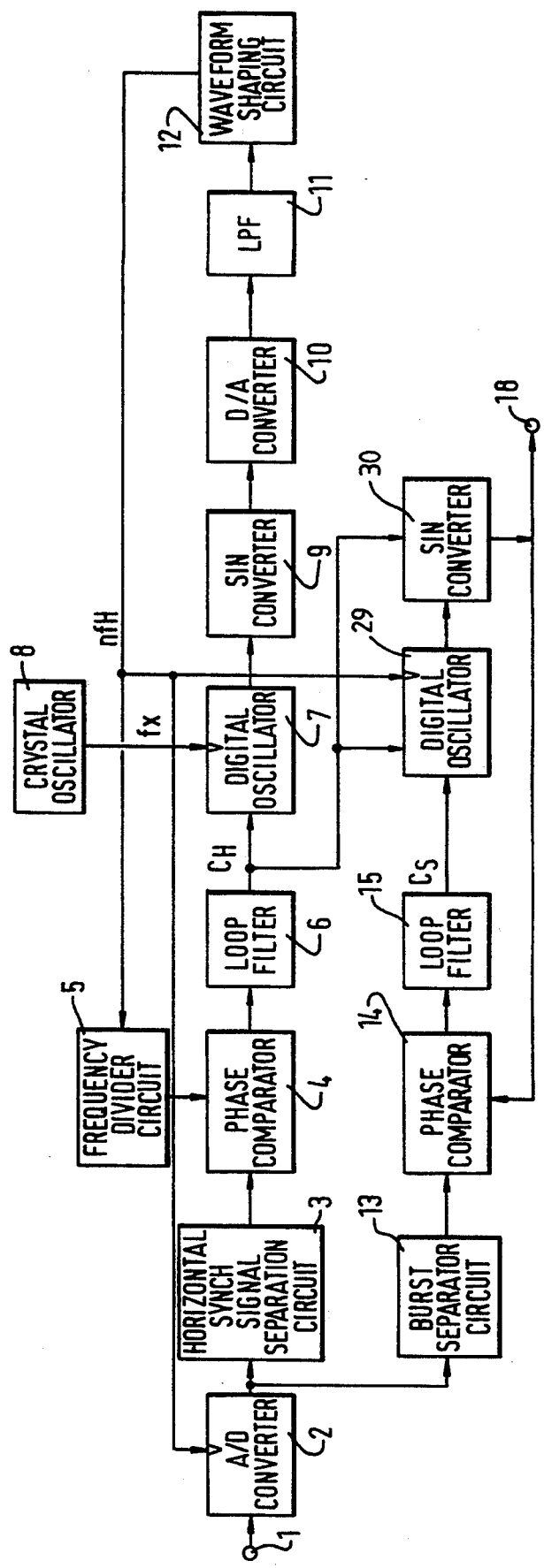
FIG. 5 shows a block diagram of an embodiment of the digital oscillator and a color subcarrier demodulation circuit in which the oscillation is used.

Referring now to FIG. 5, a first embodiment of the color subcarrier demodulation circuit having a digital oscillator according to the present invention will be described in detail.

An embodiment of this invention is described below with reference to the drawings. FIG. 5 is a block diagram showing an embodiment of the digital oscillator and the color subcarrier demodulation circuit in which the oscillation is used. In FIG. 5, components, which are the same as in FIG. 4, have been given the same symbols.

An analog video signal is input at input terminal 1. The construction of the component, which generates clock nfH and which is phase-synchronized with the horizontal synchronization signal of this input analog video signal, is the same at that in FIG. 4. That is to say, the input analog signal is supplied to A/D converter 2. A/D converter 2 samples the input analog video signal using a clock with frequency nfH from waveform shaping circuit 12, and supplies the sampled signal to horizontal synchronization signal separation circuit 3 by converting the signal to a digital signal. Horizontal synchronization signal separation circuit 3 separates the horizontal synchronization signal from the digital video signal and supplies the horizontal synchronization signal to phase comparator 4. At the same time, the output of waveform shaping circuit 12 is also input to frequency divider circuit 5. Frequency divider circuit 5 divides clock nfH from waveform shaping circuit 12 by n, and supplies the signal of frequency fH to phase comparator 4.

Phase comparator 4 compares the phases of the two inputs then and outputs a phase error signal based on the phase error to loop filter 6. Loop filter 6 integrates the phase error signal using a specified time constant then outputs the integrated output to digital oscillator 7 as control signal CH. A clock of frequency fx from crystal oscillator 8 is also supplied to digital oscillator 7. Digital oscillator 7 cumulatively integrates control signal CH from loop filter 6 using the clock cycle from crystal oscillator 8 and supplies a saw-tooth wave output of a frequency proportional to the phase error signal to SIN converter 9.

SIN converter 9 converts the input saw-tooth wave to a sine wave and supplies it to D/A converter 10. D/A converter 10 converts the input digital signal to an analog signal and supplies it to LPF 11. LPF 11 eliminates the feed-back component of the input analog signal then supplies it to waveform shaping circuit 12. Waveform shaping circuit 12 converts the output of LPF 11 to a binary digital signal and outputs it to A/D converter 2 and frequency divider 5. A PLL is composed by phase comparator 4, loop filter 6, digital oscillator 7, SIN converter 9, D/A converter 10, LPF 11, waveform shaping circuit 12 and frequency divider circuit 5.

At the same time, the digital video signal from A/D converter 2 is also supplied to burst separator circuit 13. Burst separator circuit 13 extracts the burst signal from the input video signal and outputs it to phase comparator 4. Phase comparator 14 compares the phases of the extracted burst signal and the output signal of SIN converter 30 (described below) and then supplies a phase error signal based on the phase error between these two to loop filter 15. Loop filter 15 outputs control signal CS by integrating the phase error signal using a specified time constant. In this embodiment, the design is that this control signal CS is supplied to digital oscillator 29 concerned in an embodiment of this invention. The design is that control signal CH from loop filter 6 and clock nfH from waveform shaping circuit 12 are also input to digital oscillator 29.

Figure 6:
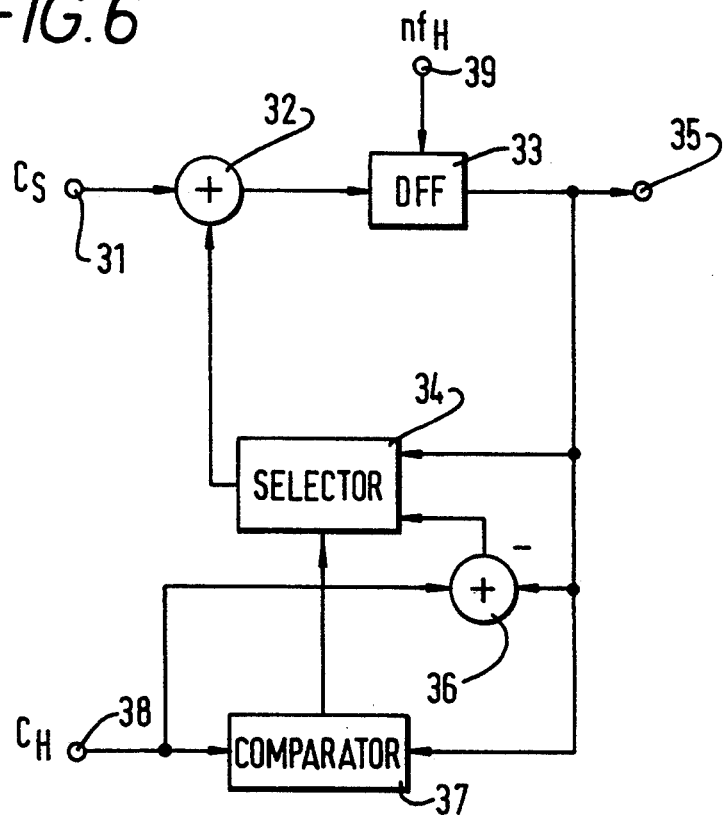
FIG. 6 shows a block diagram of a practical construction for digital oscillator 29 in FIG. 5.

FIG. 6 is a block diagram showing a practical construction for digital oscillator 29 in FIG. 5.

Control signal CS from loop filter 15 is supplied to adder 32 via input terminal 31. Adder 32 adds control signal CS and the output of selector circuit 34 (described below) and outputs the result to DFF 33. DFF 33 latches the adder 32 output using clock nfH, which is input via terminal 39, and outputs it to output terminal 35, selector circuit 34, subtractor 36 and comparator 37. At the same time, control signal CH from loop filter 6 is supplied to subtractor 36 and comparator 37 via input terminal 38. Subtractor 36 finds the difference between the output of DFF 33 and control signal CH, and outputs the difference to selector circuit 34. Comparator 37 compares the sizes of the output of DFF 33 and control signal CH, and outputs this comparison result to selector circuit 34. The design requires that selector circuit 34 selects the output of subtractor 36 in the case when the output of the DFF 33 exceeds control signal CH. In other cases, it selects the output of DFF 33 and supplies that to adder 32.

In other words, adder 32 and DFF 33 cumulatively integrate control signal CS in the same way as in prior art until control signal CH exceeds the output of DFF 33. The design requires that that, when the output of DFF 33 exceeds the control signal CH, selector circuit 34 supplies the output of subtractor 36, (i.e. only the overflow amount by which control signal CH is in excess) to adder 32 for addition to control signal CS.

The oscillation output, which appears at output terminal 35 of digital oscillator 29, is supplied to SIN converter 30. Control signal CH from loop filter 6 is also input to SIN converter 30. The design requires that SIN converter 30 converts the oscillation output of digital oscillator 29 to a sine wave after normalization through division by its amplitude CH then outputs the sine wave to output terminal 18. At the same time the sine wave is fed back to phase comparator 14.

Figure 7:
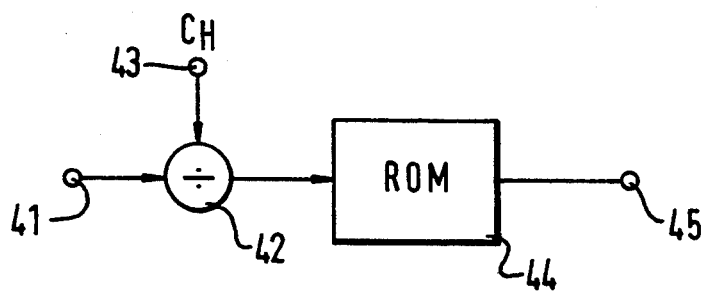
FIG. 7 shows a block diagram of a practical construction for SIN converter 30 in FIG. 5.

FIG. 7 is a block diagram showing a practical construction of SIN converter 30 in FIG. 5.

The oscillation output of digital oscillator 29 is supplied to divider 42 via input terminal 41. Control signal CH from loop filter 6 is also input to divider 42 via terminal 43. Divider 42 divides the oscillation output of digital oscillator 29 by control signal CH, and outputs this division result as a ROM 44 address. ROM 44 stores the data for converting the saw-tooth wave to a sine wave and to output the data stored at each address designated by divider 42 to output terminal 48.

Figure 8:
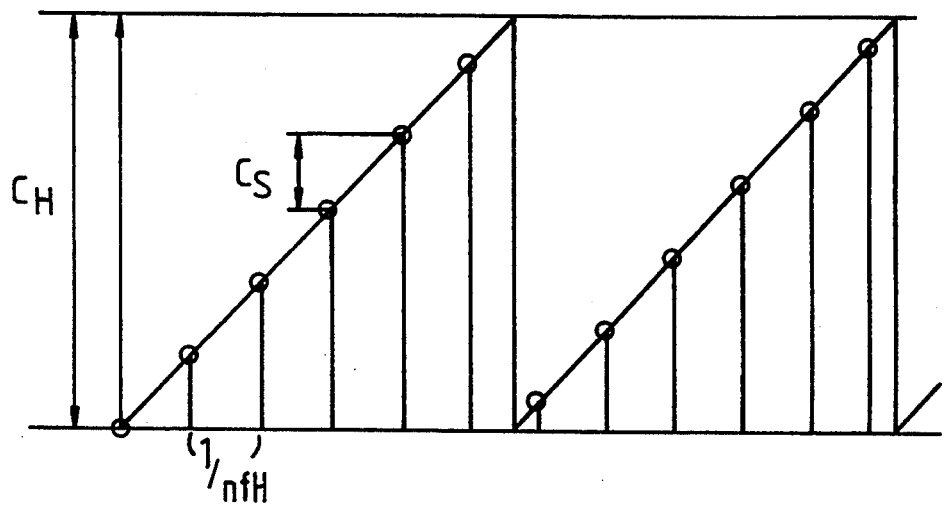
FIG. 8 shows a waveform diagram of the oscillation output of digital oscillator 29.

The following is a description of the operation of an embodiment constructed in this way with reference to FIG. 8. FIG. 8 is a waveform diagram showing the oscillation output of digital oscillator 29.

The analog video signal input via input terminal 1 is converted to a digital signal by A/D converter 2 and supplied to horizontal synchronization signal separation circuit 3. Horizontal synchronization signal separator circuit 3 separates off the horizontal synchronization signal of the input video signal and outputs it to phase comparator 4. The obtaining of clock nfH, which is n times the frequency of, and phase-synchronized with, the separated horizontal synchronization signal by a PLL composed of phase comparator 4, loop filter 6, digital oscillator 7, SIN converter 9, D/A converter 10, LPF 11, waveform shaping circuit 12 and frequency divider circuit 5, is the same as in prior art.

In this embodiment, control signal CH from loop filter 6 and clock nfH are supplied to digital oscillator 29 and SIN converter 30. Burst separator circuit 13 separates the burst signal from the output of A/D converter 2 and supplies it to phase comparator 14. In phase comparator 14, the separated burst signal is phase-compared with the output of SIN converter 17 and a phase error signal for both is supplied to loop filter 15. The phase error signal is integrated by loop filter 15 and then converted to control signal CS and supplied to digital oscillator 29.

Digital oscillator 29 cumulatively integrates control signal CS with a cycle of clock nfH. When the cumulatively integrated value exceeds control signal CH, cumulative integration of the excess amount continues as a fresh cumulative value. That is to say, as shown in FIG. 8, a saw-tooth wave with amplitude CH and a gradient determined by clock nfH and control signal CS, is output from digital oscillator 29. The oscillation frequency fsc3 of this saw-tooth wave can be expressed by the following Equation (4).

$$\begin{aligned} fsc3 &= (Cs/CH) \cdot nfx \\ &= (Cs/CH) \cdot (CH/2^{m1}) \cdot fx \\ &= (Cs/2^{m1}) \cdot fx \end{aligned} \quad (4)$$

An oscillation output from digital oscillator 29 proportional to the phase error is input to SIN converter 30. Sin converter 30 divides the oscillation output by control signal CH. As described above, the amplitude of the saw-tooth wave from digital oscillator 29 is CH, and fluctuates according to control signal CH. Thus, SIN converter 30 normalizes the saw-tooth wave by dividing it by CH. It outputs sine wave data from ROM 44 by making this normalized value a ROM 44 address. The output of SIN converter 30 is fed back to phase comparator 14. A demodulated color subcarrier, which is phase-synchronized with the burst signal, can be obtained at output terminal 18 by a PLL composed of phase comparator 14, loop filter 15, digital oscillator 29 and SIN converter 30.

As shown in Equation (4) above, the oscillation frequency of digital oscillator 29 is not subject to the influence of control signal CH. Therefore, even when the horizontal synchronization frequency changes rapidly, stable demodulation of the color subcarrier can be achieved without being influenced by this change. Moreover, in this embodiment, the control signal CH can be supplied to digital oscillator 29 without influencing the control signal CS from loop filter 15. For this reason, operation errors are not accumulated, even if digital oscillator 29 executes cumulative integration. That is to say, the scale of the circuit can be made more compact, since there is no requirement to increase the number of bits.

In this way, in this embodiment, control signal CS from loop filter 15 is supplied to digital oscillator 29 as it stands. Therefore, in contrast to prior apt, operation errors do not accumulate in the cumulative integration value of digital oscillator 29. Digital oscillator 29 cumulatively integrates control signal CS at every clock nfH and, at the same time, it regulates its integrated value by control signal CH from loop filter 6. The oscillation frequency is made proportional to CH by operating at clock nfH and is made proportional to CS/CH by regulating the upper limit at CH. That is to say, the influence of control signal CH is cancelled out, and the oscillation frequency becomes proportional to control signal CS. Therefore, a stable demodulated color subcarrier can be obtained.

Figure 9:
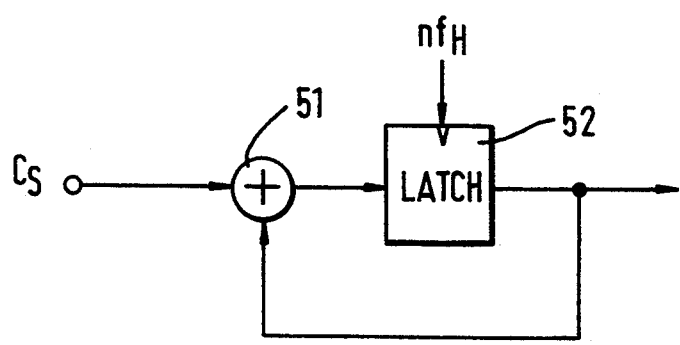
FIG. 9 shows a block diagram of another example of the digital oscillator of the invention.

Incidentally, as shown in FIG. 9, an accumulator composed of adder 51, which executes the operation [modk.CS] for an arbitrary numerical CS and a regular integer k, and latch 52, which outputs to adder 51 by latching the output of adder 51, may be employed as the digital oscillator. In this case, the oscillation frequency is adjusted by suitably setting the [modk.CS] of adder 51.

When using this invention as described above, a stable demodulated color subcarrier can be oscillated with a smallscale circuit.

As described above, the present invention can provide an extremely preferable digital oscillator and a color subcarrier demodulation circuit including the digital oscillator.

It has been illustrated and described what are, at present, considered to be preferred embodiments of the present invention, it will be further understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

What is claimed is:

1. A digital oscillator for producing an output signal comprising:
   integration means for cumulatively adding a specified signal and a control means output and for outputting said output signal; and
   control means for comparing said output signal and a control signal, said control means adapted to produce said control means output, said control means output being said output signal when said control signal is greater than said output signal, said control means output being a difference between said output signal and said control signal when said control signal is less than said output signal, said control means output being sent to said integration means so that an output frequency of said integration mean is maintained.

2. The digital oscillator of claim 1, wherein said control means comprises:
   comparator means for comparing said control signal with said output signal, said comparator means adapted to output a comparator signal;
   subtractor means for subtracting said control signal from said output signal and producing said difference;
   selector means for selecting between said difference and said output signal based on said comparator signal.

3. The digital oscillator of claim 1 wherein said integration means comprises adding means for adding said specified signal with said control means output.

4. The digital oscillator of claim 3, wherein said integration means further comprises means for latching said output signal according to a clock signal.

5. The digital oscillator of claim 4, wherein said latching means comprises a data flip-flop circuit.

6. A color subcarrier demodulation circuit comprising:
   horizontal synchronization signal separation means for separating a horizontal synchronization signal from an input television signal;
   first phase comparator means for comparing said horizontal synchronization signal and a demodulated horizontal synchronization signal and for outputting a first phase error signal;
   horizontal synchronization signal demodulation means for generating said demodulated horizontal synchronization signal based on said first phase error signal;
   burst separator means for separating a burst signal from said input television signal;
   second phase comparator means for comparing said burst signal and a demodulated color subcarrier signal and for outputting a second phase error signal;
   digital oscillator means for producing an oscillation output, comprising:
   integration means for cumulatively adding said second phase error signal and a control means output and for outputting said oscillation output; and
   control means, responsive to said first phase error signal, for maintaining an output frequency of said integration means within a limit corresponding to an amplitude of said first phase error signal and for providing said control means output;
   a normalization circuit for normalizing said oscillation output in response to said first phase error signal, said normalized oscillation output being input to said second phase comparator as said demodulated color subcarrier signal.

7. The color subcarrier demodulation circuit of claim 6, wherein said control means comprises:
   comparator means for comparing said first phase error signal with said oscillator output, said comparator means adapted to output a comparator signal;
   subtracter means for finding a difference between said first phase error signal from said oscillation output;
   selector means for selecting between said difference and said oscillation output based on said comparator signal.

8. The color subcarrier demodulation circuit of claim 6, wherein said integration means comprises adding means for adding said second phase error signal with said control means output.

9. The color subcarrier demodulation circuit of claim 8, wherein said integrating means further comprises means for latching said oscillation output according to a clock signal.

10. The color subcarrier demodulation circuit of claim 9, wherein said latching means comprises a data flip-flop circuit.

* * * * *